Dec. 5, 1950 W. H. FALCONER ET AL 2,532,701

METHOD OF MAKING INTAGLIO OR GRAVURE PRINTING PLATES

Filed March 20, 1947

INVENTORS.
William H. Falconer
L. Calder Estler
by Byerly, Watson & Simonds
ATTORNEYS Patented Dec. 5, 1950 2,532,701

UNITED STATES PATENT OFFICE 2,532,701

METHOD OF MAKING INTAGLIO OR GRAVURE PRINTING PLATES

William H. Falconer, Ridgewood, and Louis Calder Estler, Wortendyke, N. J.

Application March 20, 1947, Serial No. 736,088

3 Claims. (Cl. 95—5)

This invention relates to a method of making intaglio or gravure printing plates, and more particularly to a method of making a resist for the etching of such plates. The method eliminates a step which has previously been necessary in making such resists, and thus reduces the time and cost required to make the resists for intaglio etching. The method may be used to make an improved intaglio plate which is the subject-matter of our co-pending application filed concurrently herewith.

An intaglio or gravure printing plate or cylinder has a smooth surface which is wiped clean by the doctor blade in printing and a large number of minute indentations, cavities, pockets or wells which carry the ink which is deposited on the paper. The smooth surface is the top of walls surrounding the wells or pockets.

The resist used in etching intaglio plates is a sheet of hardened gelatin having thick portions to prevent etching on the portions of the plate where the smooth surface or walls are to be formed and thinner portions of various different thicknesses which control the etching of the wells in the plate and provide for etching them of different depths. Such resists are made by exposing a carbon tissue successively through two different transparencies, one of which provides for a deep exposure of the wall portions for the resist and the other of which provides for exposures of different depths on the portions of the resist which are to form the wells or cavities.

In making a resist for an ordinary or conventional intaglio plate in which the pockets are of uniform area but vary in depth, the two transparencies which are successively printed on the carbon tissue are (1) a so-called gravure screen which has opaque areas to cover the portions of the resist which are to form cavities and transparent lines to expose the portions of the resist which are to form the walls, and (2) a continuous-tone positive of the picture to be printed whose varying densities result in varying exposure of the portions of the resist which are to form the cavities. Each of these transparencies must be separately assembled with the carbon tissue in a printing frame to make the two exposures.

In making a resist for the improved type of intaglio plate in which the pockets vary both in area and in depth, the gravure screen is replaced by a structured transparency of the picture. This is usually a positive half-tone transparency in which the tone range is only half that used in an ordinary half-tone. Such a transparency has separated opaque portions of different areas which cover the portions of the resist which are to form cavities and a transparent area surrounding the opaque portions to expose the portions of the resist which are to form the walls. In order to make the required two exposures in this case, it is necessary to assemble the half-tone transparency with the carbon tissue in a printing frame and then to open the printing frame, remove the half-tone transparency, and substitute the continuous-tone transparency. The assembly of the two transparencies with the carbon tissue requires care and skill, as it is essential that the prints of the two transparencies be in register on the carbon tissue.

The method which we have invented avoids the necessity of assembling the carbon tissue with two separate transparencies. In our method only a single transparency is used. It is a structured transparency of the picture to be printed and may be a half-range positive half-tone transparency of the picture. In assembling it with the carbon tissue in a printing frame, the transparency is not brought into contact with the face of the tissue in the usual manner, but a transparent spacer is placed between them. The carbon tissue is twice exposed through the half-tone transparency and the spacer, without disassembling. One of the exposures is made by "direct light," by which we mean light from a point source or from a small source so far away from the printing frame that the opaque dots of the half-tone transparency cast sharp shadows on the carbon tissue. The second exposure is made by diffused light which cuts under the opaque dots of the half-tone transparency, so that the dots cast on the carbon tissue diffused shadows without sharp edges. The extent to which the shadows of the dots are blurred depends on the thickness of the transparent spacer and the degree of diffusion of the diffused light. These may be made so great that the dot formation is altogether lost, thus giving the same effect as exposing the tissue through a continuous-tone transparency. The method thus provides for printing both a half-tone or structured image and a continuous-tone image on the carbon tissue with the use of only one transparency and without disassembling the printing frame.

The resist made in this way is similar to those previously made by exposing the tissue through separate half-tone and continuous-tone transparencies of the picture, but it may be made much more rapidly and at less expense as there is no disassembly and reassembly and no problem of registration.

It is not necessary in practicing our method to make the transparent spacer so thick and the light so diffused that the dot formation is altogether lost in the diffused light exposure. It is sufficient to make the thickness of the spacer and the degree of diffusion of the light such that the shadows of the dots lose their sharp outlines so as to print on the tissue an image which may be termed a "diffused-dot" half-tone. By this we mean an image in which the sharp edged dots of uniform density of the ordinary half-tone are replaced by dots which are most dense at their centers and whose density tapers off in all directions towards their peripheries so that their edges are not sharply defined.

In order that our invention may be clearly understood, we will describe in detail a specific method embodying it which is illustrated in the accompanying drawings in which.

A structured transparency of the picture to be printed is required in our method. By a "structured transparency" we mean a transparency having transparent portions and opaque portions of uniform density, so arranged that in each part of the picture the tone of the original is represented by the ratio between opaque area and transparent area on that part of the transparency. The structured transparency may be made by known methods including photoelectric methods and photographic methods. The simplest way of making it is by photographing a continuous-tone negative of the original picture through a half-tone screen. The exposure and the position of the screen should be such that the darkest tones of the original are represented by substantially separate opaque dots on a transparent field and the other tones of the picture are represented by smaller opaque dots on the transparent field.

The first step in our method consists in assembling the structured transparency T and an ordinary carbon tissue C in a printing frame with a transparent spacer S between them. The spacer should be of one one-hundredth of an inch or less in thickness. We have found spacer thicknesses from .0015 inch to .01 inch satisfactory. As an example, we specify a spacer of a thickness of .006 inch made of clear cellulose acetate sheeting.

Two exposures are made, one with direct light and the other with diffused light.

The direct-light exposure may conveniently be made by means of an arc lamp provided with a reflector. We have found that if the reflector is nine inches in diameter and is placed six feet from the printing frame the effect of a point source is obtained, that is to say, the dots of the transparency make sharp shadows on the carbon tissue.

Figure 1:
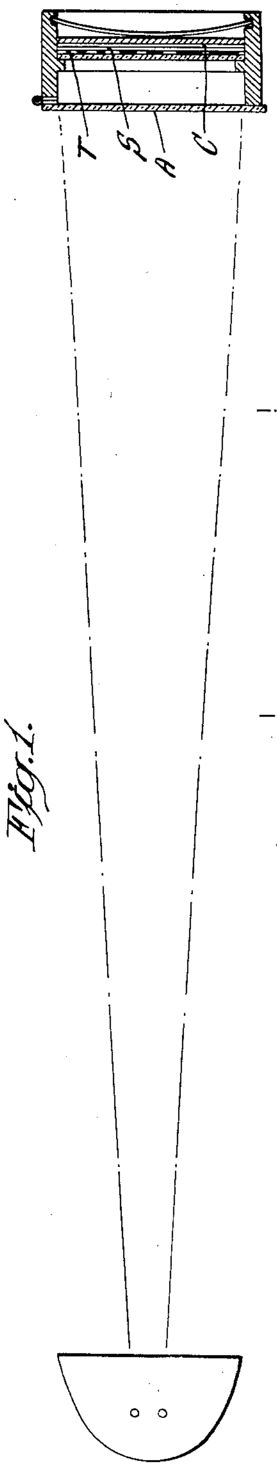
Fig. 1 shows an arrangement of the printing frame and light for making the exposures in accordance with our method.

For making the diffused-light exposure, it is convenient to use the same arc lamp and to obtain the required diffusion by placing a diffusing screen between the lamp and the printing frame. As an example, we specify a diffusing screen A of cellulose acetate sheeting having one matte surface, attached to the printing frame at a distance of two inches from the structured transparency, as shown in Fig. 1.

The exposure by diffused light should be longer than the exposure by the direct light. As an example which we have found satisfactory, we specify in the arrangement shown in Fig. 1 a direct-light exposure of eight minutes and a diffused-light exposure of twenty minutes.

Figures 2, 3, 4, 5:
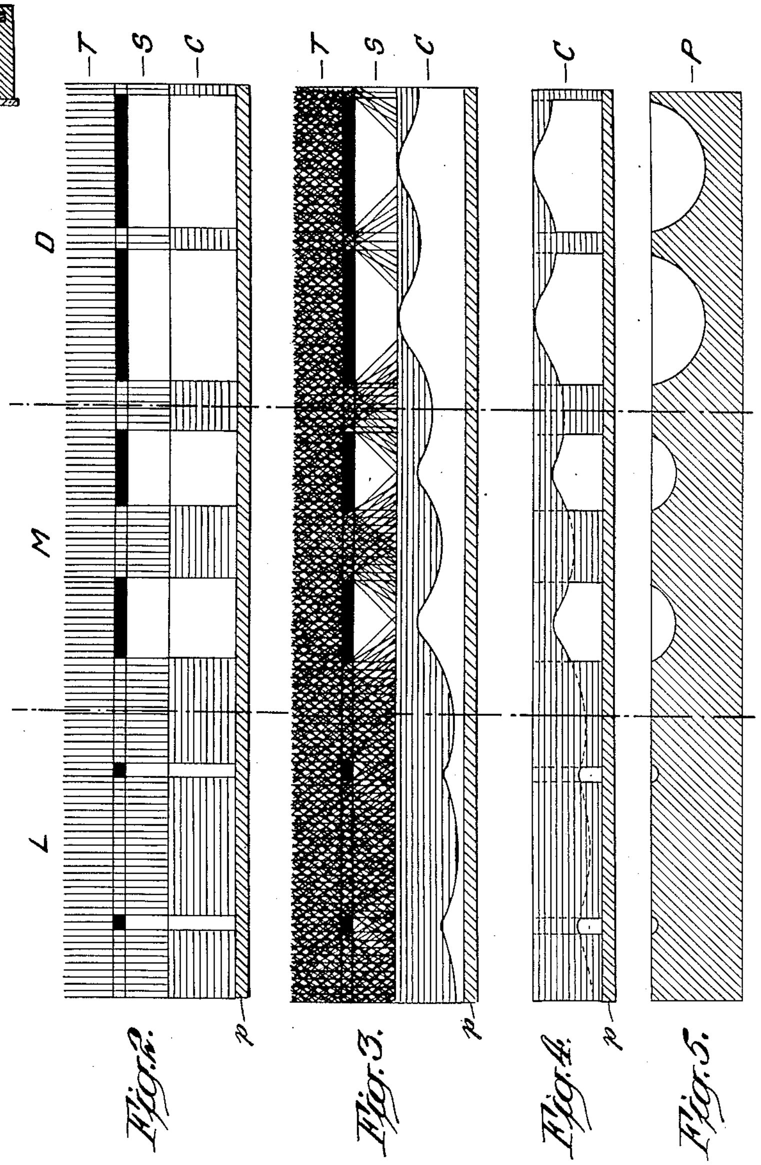
Figs. 2 and 3 are greatly enlarged transverse sections of the carbon tissue, spacer and transparency showing separately the effects of the two exposures made in our method.
Fig. 4 is an enlarged section of the carbon tissue showing the combined effect of the two exposures made in our method.
Fig. 5 is an enlarged transverse section of a printing plate showing the effect of etching through a resist made from the carbon tissue shown in Fig. 4.

The effects of the two exposures are shown separately in Figs. 2 and 3. These figures show three parts of the structured transparency T, namely, a light-tone part L, a middle-tone part M and a dark-tone part D. The opaque dots (shown as black) are of different sizes in the three parts.

Fig. 2 shows the direct light as parallel rays. The effect of the direct-light exposure, as shown in Fig. 2, is to cast sharp shadows of the dots on the carbon tissue C so as to leave the parts of the tissue lying directly behind the dots unexposed, and to fully expose the remainder of the tissue. The parts of the tissue which are hardened by the exposure are indicated by horizontal shading.

Fig. 3 shows the diffused light as rays extending in different directions. The effect of the diffused-light exposure, as shown diagrammatically in Fig. 3, is to cause a graded hardening of the gelatin of the tissue. In the light-tone area L, the tissue is more exposed and therefore more deeply hardened than in the middle-tone area M and the dark-tone area D. In all areas, the parts of the tissue lying directly behind the centers of the dots are less exposed and therefore less deeply hardened than the parts of the tissue lying under the peripheries of the dots. The result is to form in the gelatin an exposed hardened layer whose back surface contains rounded depressions with no sharp lines of demarcation between them.

In the actual method, the two exposures are made successively on the same carbon tissue. The effect of the two exposures is therefore to harden both the part of the gelatin which is exposed to the direct light (indicated by shading in Fig. 2) and the part which is exposed to the diffused light (indicated by shading in Fig. 3). Whichever exposure be made first, the hardened part of the gelatin sheet has the form shown in Fig. 4 after the two exposures have been made. (The dotted lines in Fig. 4 are merely for convenience in comparing Fig. 4 with Figs. 2 and 3, and have no physical significance.)

After the two exposures, the front face of the carbon tissue is applied to the metal plate or cylinder to be etched, the paper backing p is stripped off, and the unexposed gelatin is washed away in the usual manner. The result is to provide a resist corresponding to the shaded portion of Fig. 4, except that its position is reversed so that the surface shown at the top of Fig. 4 is the lower surface of the resist which is in contact with the plate to be etched. The resist is a sheet of hardened gelatin having thick portions of uniform height surrounding conoidal depressions which vary both in depth and in area in accordance with the tone.

A printing plate P etched through such a resist by the usual multi-stage etching contains conoidal cavities varying in depth and in area in accordance with the tone and separated by walls whose tops form a smooth surface, as shown in Fig. 5. The plate has all the advantages of the improved type of intaglio plate in which both the depth and the area of the pockets vary with the tone. It has also a special new advantage resulting from the conoidal shape of the pockets or wells which facilitates the withdrawing of ink from them in rapid printing.

Our method may also be carried out by using a spacer of such thickness or diffused light of such degree of diffusion that the dot formation is altogether lost in the diffused-light exposure. This result may be obtained with a spacer of the thickness hereinbefore specified by changing the material of the diffusing screen A from the matte cellulose acetate sheeting to opal glass which gives nearly one hundred per cent diffusion. In this case, the diffused-light exposure will harden the gelatin of the carbon tissue to different depths in the different tone areas, but the hardened portion will not contain depressions behind the dots as shown in Fig. 3. The resist produced by the two exposures will have depressions varying in area and depth, but these depressions will have straight sides instead of the inclined sides shown in Fig. 4, so that the plate will have cylindrical pockets instead of the conoidal pockets shown in Fig. 5. The plate is similar to the improved type of intaglio plate which has heretofore been made, but, as previously explained, it can be made much more economically by our method and by previous methods in which two transparencies must be used.

What is claimed is:

1. A two-exposure method of making a resist for intaglio etching by means of a single structured positive transparency having transparent portions and opaque portions of uniform density so arranged that in each part of the picture the tone of the original is represented by the ratio between opaque area and transparent area on that part of the transparency and the darkest tone is represented by substantially separate opaque dots, which comprises assembling said transparency and a carbon tissue with a transparent spacer between them, and making two successive exposures of the carbon tissue through the structured transparency and the spacer, one with direct light which casts a sharp shadow of the dots of the structured transparency upon the carbon tissue and the other with diffused light which cuts under the dots of the structured transparency and casts a blurred shadow of them upon the carbon tissue.

2. A two-exposure method of making a resist for intaglio etching by means of a single structured positive transparency having transparent portions and opaque portions of uniform density so arranged that in each part of the picture the tone of the original is represented by the ratio between opaque area and transparent area on that part of the transparency and the darkest tone is represented by substantially separate opaque dots, which comprises assembling said transparency and a carbon tissue with a transparent spacer of the thickness between one one-thousandth and one one-hundredth of an inch between them, and making two successive exposures of the carbon tissue through the structured transparency and the spacer, one with light from a source sufficiently distant to cast a sharp shadow of the transparency through the spacer upon the tissue and the other with diffused light which, in the spacer, cuts under the dots of the transparency and casts a blurred shadow of the transparency on the tissue.

3. A two-exposure method of making a resist for intaglio etching by means of a single structured positive transparency having transparent portions and opaque portions of uniform density so arranged that in each part of the picture the tone of the original is represented by the ratio between opaque area and transparent area on that part of the transparency and the darkest tone is represented by substantially separate opaque dots, which comprises assembling said transparency and a carbon tissue with a transparent spacer of about .006″ thickness between them, making an exposure of the tissue through the structured transparency and the spacer by direct light which casts a sharp shadow of the dots of the structured transparency upon the carbon tissue, and placing a diffusing screen in front of the transparency and making a longer exposure of the carbon tissue through the structured transparency and the spacer with light which has passed through the diffusing screen.

WILLIAM H. FALCONER.
LOUIS CALDER ESTLER.

REFERENCES CITED

The following references are of record in the file of this patent:

UNITED STATES PATENTS

| Number | Name | Date |
|---|---|---|
| 1,477,866 | Deeks | Dec. 18, 1923 |
| 1,532,696 | Hassard | Apr. 7, 1925 |
| 2,112,416 | Dewberry | Mar. 29, 1938 |
| 2,226,086 | Wilkinson | Dec. 24, 1940 |
| 2,407,211 | Yule | Sept. 3, 1946 |

FOREIGN PATENTS

| Number | Country | Date |
|---|---|---|
| 274,422 | Great Britain | June 14, 1928 |